United States Patent
Dai et al.

(10) Patent No.: US 12,396,271 B2
(45) Date of Patent: Aug. 19, 2025

(54) RIBBONS FOR USE IN SHINGLED SOLAR CELLS

(71) Applicant: Maxeon Solar Pte. Ltd., Singapore (SG)

(72) Inventors: Mingchong Dai, Yantai (CN); Qiang Zhang, Singapore (SG); Nicholas Eli Berry, Beaverton, OR (US); Jianfang Si, Kunshan (CN); Hongshuai Xu, Singapore (SG); Yafu Lin, San Jose, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 18/110,710

(22) Filed: Feb. 16, 2023

(65) Prior Publication Data
US 2024/0282876 A1    Aug. 22, 2024

(51) Int. Cl.
*H10F 19/90* (2025.01)
*H10F 71/00* (2025.01)
*H10F 77/00* (2025.01)
*H10F 77/14* (2025.01)

(52) U.S. Cl.
CPC ....... *H10F 19/904* (2025.01); *H10F 71/1221* (2025.01); *H10F 77/147* (2025.01); *H10F 77/937* (2025.01)

(58) Field of Classification Search
None
See application file for complete search history.

(56) References Cited

U.S. PATENT DOCUMENTS

| | | | |
|---|---|---|---|
| 4,348,546 A | 9/1982 | Little | |
| 4,380,112 A | 4/1983 | Little | |
| 4,450,033 A | 5/1984 | Little | |
| 9,530,926 B2 | 12/2016 | Hachtmann et al. | |
| 9,698,292 B2* | 7/2017 | Storbeck | H01L 31/0508 |
| 10,741,712 B2* | 8/2020 | He | H01L 31/0488 |
| 2007/0283997 A1* | 12/2007 | Hachtmann | H01L 31/048 |
| | | | 136/244 |
| 2014/0261659 A1 | 9/2014 | Babayan et al. | |
| 2014/0261661 A1 | 9/2014 | Babayan et al. | |
| 2014/0262793 A1 | 9/2014 | Babayan et al. | |
| 2015/0129024 A1 | 5/2015 | Brainard et al. | |
| 2016/0027947 A1 | 1/2016 | Babayan et al. | |
| 2016/0172520 A1* | 6/2016 | Nakamura | H01L 31/0508 |
| | | | 136/244 |

FOREIGN PATENT DOCUMENTS

| | | |
|---|---|---|
| CN | 13921657 A | 1/2022 |
| KR | 20140105520 A | 9/2014 |
| WO | 2014/159146 A1 | 10/2014 |
| WO | 2015073303 A1 | 5/2015 |

\* cited by examiner

*Primary Examiner* — Tamir Ayad
(74) *Attorney, Agent, or Firm* — Schmidt Patent Law, Inc.

(57) ABSTRACT

A string of solar cells is disclosed. The sides of the solar cells have a corrugated shape which forms an opening when the solar cells are arranged in a shingled manner. The solar cells are electrically connected in series by a ribbon that passes through the opening. A wire mesh used to decrease solar cell resistance is also disclosed.

13 Claims, 10 Drawing Sheets

RIBBONS FOR USE IN SHINGLED SOLAR CELLS

FIELD OF THE INVENTION

The invention relates generally to solar cell modules or panels and the solar cells within the solar cell modules.

BACKGROUND

Alternate sources of energy are needed to satisfy ever increasing world-wide energy demands. Solar energy resources are sufficient in many geographical regions to satisfy such demands, in part, by provision of electric power generated with solar (e.g., photovoltaic) cells.

Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to conductive regions on the solar cell to direct an electrical current from the cell to an external circuit. When solar cells are combined in an array such as a solar cell module, the electrical energy collected from all of the solar cells can be combined in series and parallel arrangements to provide power with a desired voltage and current.

SUMMARY

This specification discloses a solar module having at least one string of solar cells arranged in a shingled manner. Each solar cell is a crystalline silicon solar cell having a substantially rectangular shape. Each solar cell has a front surface with a metallization pattern and a rear surface with a metallization pattern. Each solar cell has at least one long edge having a corrugated shape, where the corrugated shape comprises protruding portions and recessing portions. The solar cells in the string are arranged in a shingled manner with the protruding portions of one cell overlapping with an adjacent solar cell. The solar cells are shingled so that creates the recessing portions of each cell create openings within the string of solar cell. The shingled solar cells are electrically connected in series by an electrically conductive ribbon which passes through an opening created a recessing portion to electrically connect the rear surface metallization of one cell with the front surface metallization of an adjacent cell.

The solar module disclose may have multiple strings of solar cells with cells within each string electrically connected in series and the strings electrically connected in parallel.

In some embodiments, the front surface metallization pattern of each solar cell comprises a plurality of busbars oriented parallel to a short side of the solar cell and the electrically conductive ribbon is disposed onto a busbar. In some embodiments, the ribbon is soldered onto the busbar. In some embodiments, the portion of the ribbon disposed on or solder on the busbar runs parallel to the short side of the solar cell. In some embodiments, the busbars in one cell are aligned with busbars in an adjacent cell. In some embodiments, the busbars in one cell are not aligned with busbars of an adjacent cell. In some embodiments, the busbars in one cell are not aligned with busbars of an adjacent cell but are aligned with busbars of the cell adjacent to an adjacent cell.

In some embodiments, the busbars of each solar cell are oriented parallel the short side of the solar cell and aligned with a recessing portion of the long side of the solar cell.

In some embodiments, the string of solar cell comprises solar cells having a different alignment of recessing portions. In some embodiments, the recessing portions of one cell is aligned with the protruding portions of an adjacent cell. In some embodiments, the recessing portions of one cell is aligned with the protruding portions of both adjacent cells. In some embodiments, the recessing portions of one cell is not aligned with, e.g. is offset from, the recessing portions of an adjacent cell. In some embodiments, the recessing portions of one cell are not aligned with the recessing portions of both adjacent cells.

In some embodiments, each solar cell has a long side with a corrugated shape and another long side that is straight. In some embodiments, each solar cell has two long sides with corrugated shapes.

This specification discloses a solar module having at least two strings of solar cells electrically connected in parallel. Each string contains solar cells arranged in a shingled manner. Each solar cell is a crystalline silicon solar cell having a substantially rectangular shape. Each solar cell having a long side with a corrugated shape, where the corrugated shape comprises protruding portions and recessing portions, and another long side that is straight. Each solar cell has a front surface with a metallization pattern with busbars oriented parallel to the short side of the solar cell and aligned with a recessing portion of the long side. Each solar cell having a rear surface with a metallization pattern. The solar cells in each string are arranged in a shingled manner with the protruding portions of one cell overlapping with an adjacent solar cell. The solar cells are shingled so that creates the recessing portions of each cell create openings within the string of solar cell. The solar cells are shingled so that recessing portions in adjacent solar cells are offset. The solar cells are shingled so that the busbars in one cell are not aligned with busbars of an adjacent cell but are aligned with busbars of the cell adjacent to an adjacent cell. The shingled solar cells within each string are electrically connected in series by electrically conductive ribbons which passes through openings created recessing portions to electrically connect the rear surface metallization of one cell with the front surface metallization of an adjacent cell.

This specification discloses a solar cell having a front surface with metallization pattern. The metallization pattern comprises a conductive material, e.g. silver. The metallization pattern has busbars and fingers. The fingers are connected to the busbar, oriented perpendicular to the busbar, and parallel to each other. The solar cell has a wire mesh having wires and ribbons made of a second conductive material, e.g. copper. The wires and ribbons form a grid with the wires parallel to each other and perpendicular to the ribbons. The wire mesh is attached to the metallization by attaching the wires of the wire mesh to the fingers of the metallization. In some embodiments, the wires are soldered onto the fingers of the metallization. In some embodiments, a wire of the wire mesh may connect two fingers of the metallization. In some embodiments, the two fingers connected are connected to different busbars of the metallization. In some embodiments, the ribbons of the wire mesh are aligned with the busbar of the metallization. In some embodiments, the ribbons of the wire mesh are not aligned with the busbars of the metallization.

This specification discloses a method of assembling a solar cell. This method comprises assembling a wire mesh having wires oriented parallel to each other and ribbons attached to the wires where the ribbons oriented perpendicular to the wires. This method further comprises providing a solar cell having a surface metallization pattern with fingers oriented parallel to each other. This method further comprises after assembling the wire mesh, disposing the wire mesh onto the surface metallization of the solar cell so that the wires of the wire mesh are aligned with the fingers of the metallization pattern; and then attaching the wire mesh to the metallization pattern.

BRIEF DESCRIPTION OF THE DRAWINGS

The figures described below depict various aspects of the system and methods disclosed herein. Each figure depicts an embodiment of a particular aspect of the disclosed system and methods, and that each of the figures is intended to accord with a possible embodiment thereof. Further, wherever possible, the following description refers to the reference numerals included in the following figures, in which features depicted in multiple figures are designated with consistent reference numerals.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "substantially parallel" and to encompass minor deviations from parallel geometries. The term "perpendicular" is intended to mean "perpendicular or substantially perpendicular" and to encompass minor deviations from perpendicular geometries rather than to require that any perpendicular arrangement described herein be exactly perpendicular. The term "square" is intended to mean "square or substantially square" and to encompass minor deviations from square shapes, for example substantially square shapes having chamfered (e.g., rounded or otherwise truncated) corners. The term "rectangular" is intended to mean "rectangular or substantially rectangular" and to encompass minor deviations from rectangular shapes, for example substantially rectangular shapes having chamfered (e.g., rounded or otherwise truncated) corners or may have non-linear edges. The term "identical" is intended to mean "identical or substantially identical" and to encompass minor deviations in shape, dimensions, structure, composition, or configuration, for example.

Figure 1:
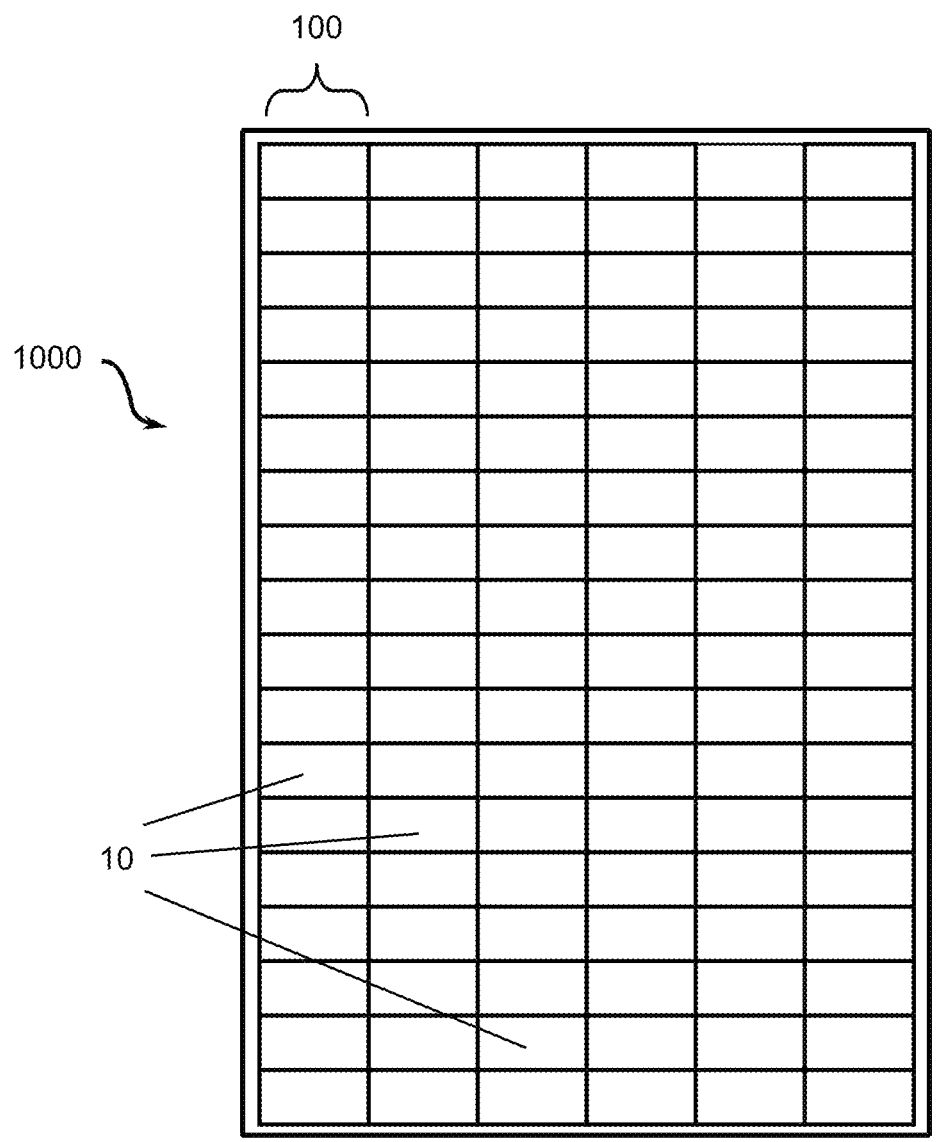
FIG. 1 schematically illustrates a solar module.

This specification discloses high-efficiency solar modules (also referred to herein as solar panels). FIG. 1 shows a solar module 1000 containing six super cells 100 arranged in parallel rows and electrically connected in parallel. Each super cell 100 in FIG. 1 contains several individual solar cells 10 arranged in a row and electrically connected in series. A solar module may comprise any suitable number of super cells and super cells may comprise any suitable number of solar cells. For example, a solar module may have 480 solar cells arranged in 6 super cells with each super cell containing 80 individual solar cells. The super cells may have lengths spanning essentially the full length or width of the solar module or two or more super cells may be arranged end-to-end in a row.

In the examples described in this specification, each solar cell 10 is a crystalline silicon solar cell having front (sunny side) surface and rear (shaded side). Between the front surface and rear surface are at least one semiconductor layer of p-type conductivity and at least one semiconductor layer of n-type conductivity. The n-type semiconductor layer and the p-type semiconductor layer meet to form an n-p junction. Each solar cell has electrical contacts or metallization on the front surface of the solar cell which makes electrical contact with a semiconductor layer on one side of the n-p junction. Further, each solar cell has electrical contacts on the rear surface of the solar cell which makes electrical contact with a semiconductor layer on the opposite side of the n-p junction. For example, if the front surface electrical contact (metallization) makes an electrical connection with the n-type semiconductor layer, then the rear surface electrical contact makes an electrical contact with the p-type semiconductor layer. However, other material systems, diode structures, physical dimensions, or electrical contact arrangements may be used if suitable.

Resistive effects in solar cells may reduce the efficiency of the solar cell by dissipating power in the resistances. Series resistance in a solar cell may be due to movement of the current through the p-n materials of the solar cell; contact resistance between the metal contact and the silicon; and resistance in the metal contacts or metallization. The design of the metallization (e.g. the metallization pattern) of a solar cell may reduce losses due to resistance. Certain features of the metallization pattern such as finger and busbar spacing may be optimized to reduce resistance of the metallization.

Figure 2:
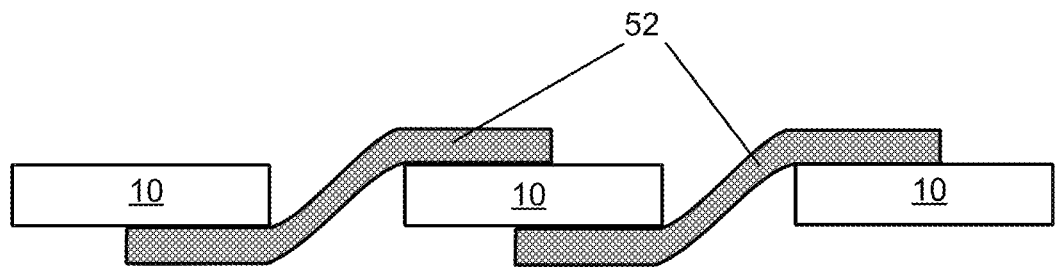
FIG. 2 schematically illustrates a cross-sectional view of a string of solar cells.

The solar cells 10 in a super cell may be electrically connected in series. This generally requires an electrical connection from the front surface of one solar cell to the rear surface of an adjacent solar cell. In traditional ribbon-connected solar cells, an electrically conductive ribbons are used to connect the back metal contact of a solar cell with the front metal contact of an adjacent solar cell. This type of connection requires a gap between solar cells to accommodate ribbons used for connecting adjacent solar cells. FIG. 2 shows a cross-sectional view of a string of solar cells 10 connected in series by ribbons 52. For solar cells 10 having electrical contacts at the front and rear surfaces of the solar cell, the ribbon must connect the front surface of one solar cell with the rear surface of an adjacent cell to make a series connection. For solar cells in FIG. 2, this series connection requires that the solar cells be spaced apart to allow ribbon 52 to make the required connection. The presence of a space between solar cells reduces the area in a solar module of a given size that can be used to generate electrical power.

Figure 3A:
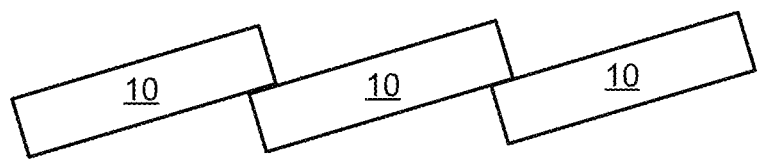
FIGS. 3A and 3B schematically illustrate cross-sectional views of a string of shingled solar cells.
Figure 3B:
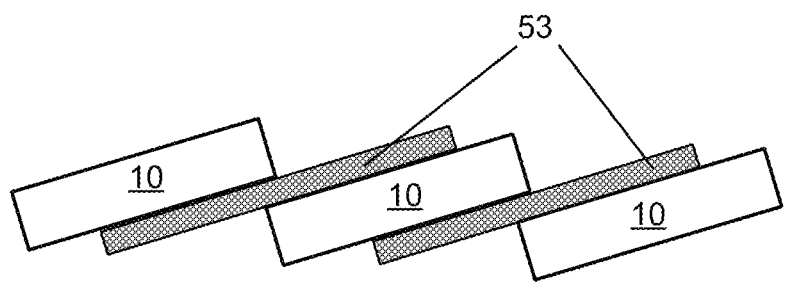

Shingling solar cells can eliminate gaps between solar cells as shown in FIGS. 3A & 3B. Shingling solar cells 10 can be electrically connected in series by using electrically conductive adhesive to bond the solar cell together as in FIG. 3A (electrically conductive adhesive not shown). Or shingled solar cells 10 can be electrically connected in series by ribbons 53 as shown in FIG. 3B.

This specification discloses high-efficiency solar modules where the solar cells within the module are both shingled and use ribbons to electrically connect the solar cells in series. This specification further discloses the use of ribbons or metal wires to decease the resistance of the solar cell.

Figure 4A:
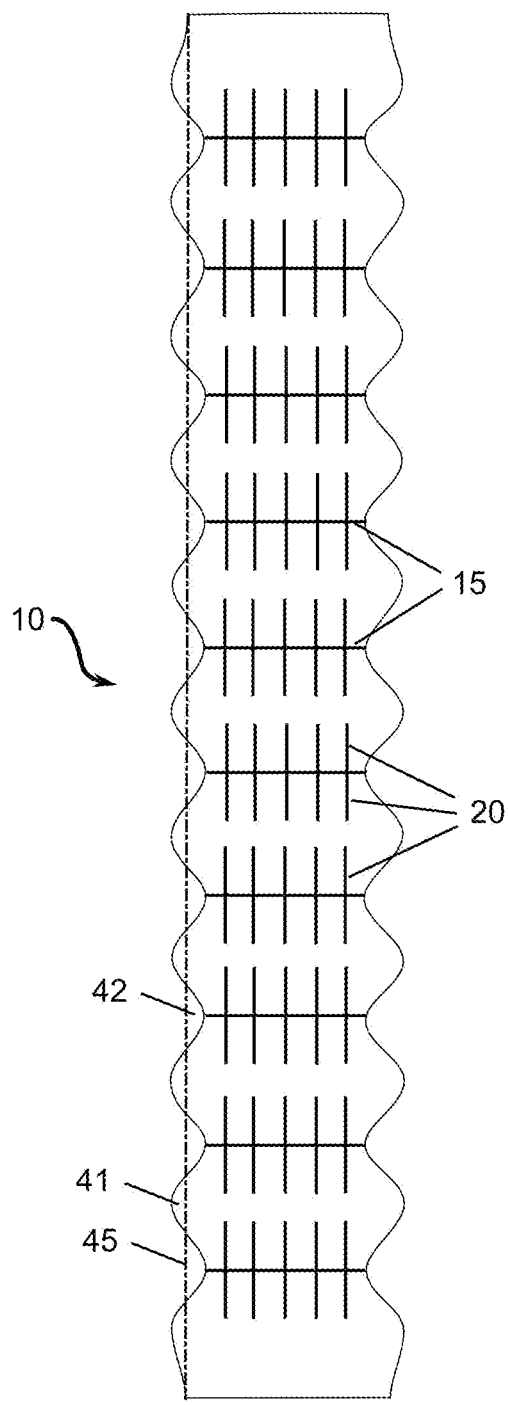
FIGS. 4A and 4B schematically illustrate a plan view of the front surface of a solar cell.

FIG. 4A shows a schematic diagram of a front surface view of solar cell 10. Solar cell 10 is rectangular or substantially rectangular having non-linear long sides. The long sides of solar cell 10 have a corrugated shape with protruding portions 41, which are portions of the solar cell that protrude or extend away from a center of the solar cell, and recessing portions 42, which are portions of the solar cell that recess towards the center of the solar cell. Protruding portion 41 protrudes or extends past the imaginary line 45 connecting the corners of the long side of the solar cell to which protruding portion 41 belongs. Recessing portion 42 is a portion of the solar cell that is recessed relative to imaginary line 45.

The front surface of solar cell 10 has an electrically conducting front surface metallization pattern that collects current generated by the solar cell when the solar cell is illuminated by light. The metallization serves as an electrical contact for the solar cell and may comprise silver. The front surface metallization pattern includes multiple busbars 15 running parallel to the short sides of solar cell 10 and running for substantially the length of the short sides of the solar cell. Multiple fingers 20 are attached substantially perpendicularly to busbars 15 and run parallel to each other. The front surface metallization may not have contact pads at the edge of the front surface which may reduce costs. The rear surface of solar cell 10 may have a similar metallization pattern as the front surface. Busbars 15 are aligned with the recessing portions 42 of the solar cell. For example, busbar 15 in FIG. 4A starts and ends at a recessing portion 42.

Figure 4B:
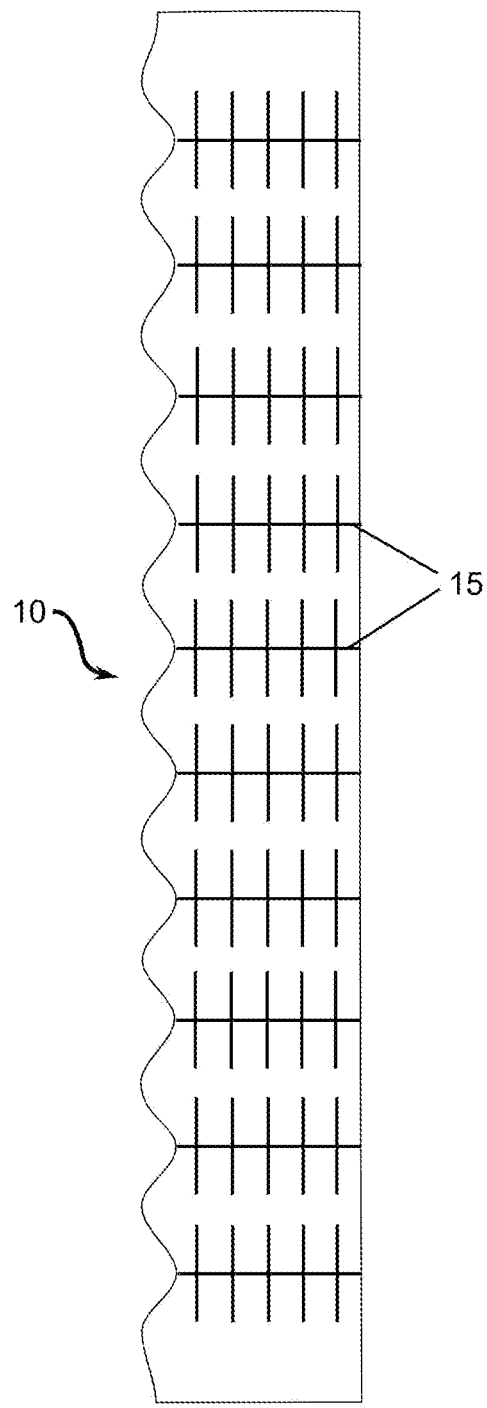

FIG. 4B shows a schematic diagram of an alternate embodiment of solar cell 10. In FIG. 4B one long side of the solar cell has a corrugated shape whereas the other long side of the solar cell has a straight edge. Busbars 15 in the solar cell of FIG. 4B have an end point at a recessing portion 42.

Figure 5:
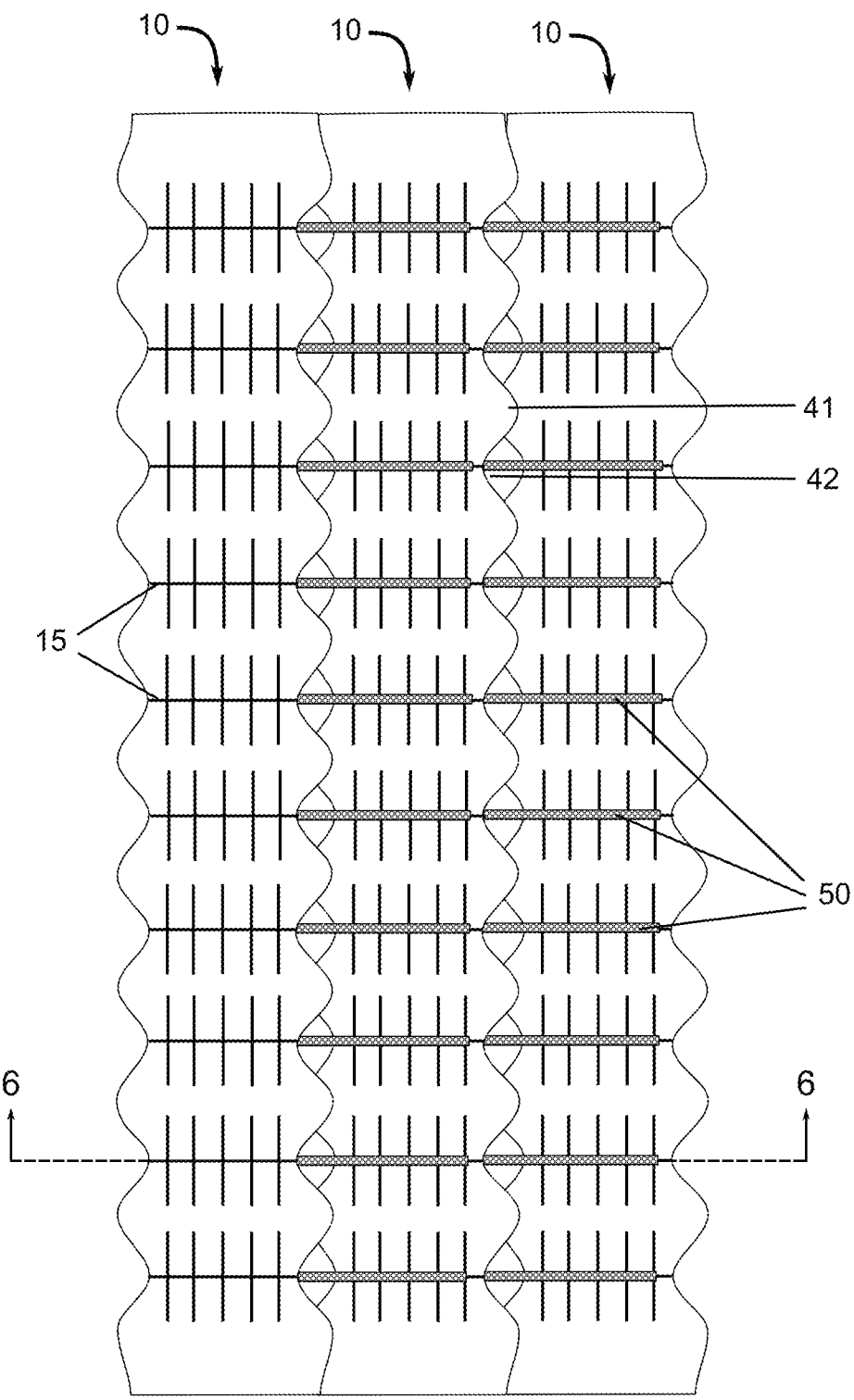
FIG. 5 schematically illustrates a plan view of a string of solar cells.
Figure 6:
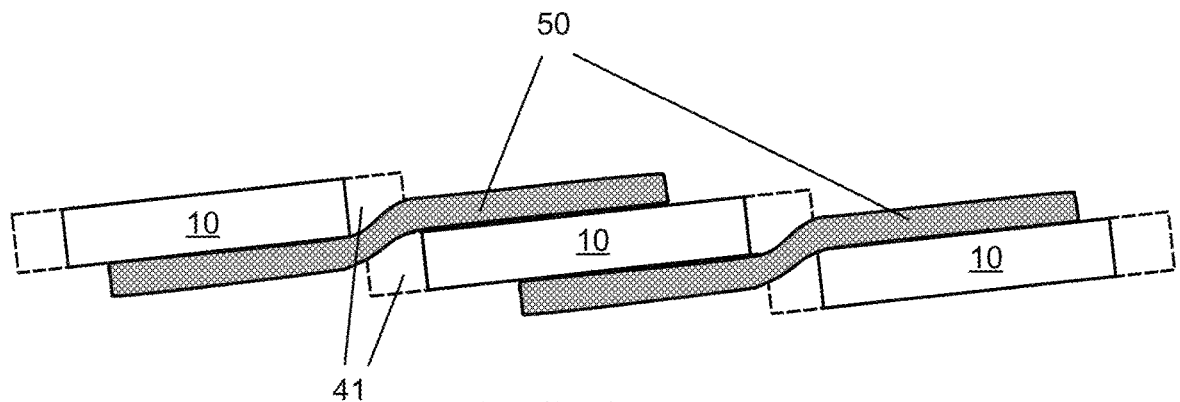
FIG. 6 schematically illustrates a cross-sectional view of the string of solar cells in FIG. 5 viewed from line 6-6.

FIG. 5 shows a schematic diagram of a plan (front surface) view of string of series-connected solar cells 10 shown in FIG. 4A arranged in a shingled manner. This string of solar cells may form a portion of super cell 100. The solar cells are arranged so that the protruding portion 41 of one solar cell overlaps with the front surface of an adjacent solar cell but recessing portion 42 does not overlap with the front surface of the adjacent solar cell. This arrangement creates an opening comprising the recessing portions of adjacent solar cells. FIG. 6 shows a cross-sectional view of the string of solar cells through line 6-6 in FIG. 5. Protruding portions 41 are outlined with dashed lines in FIG. 6 and are behind ribbon 50 in this cross-sectional view.

Solar cells 10 are electrically connected in series to each other using electrically conductive ribbons 50 to connect the front surface metallization (not shown in FIG. 6) of one solar cell with the rear surface metallization (not shown in FIGS. 5 & 6) of an adjacent solar cell. Ribbon 50 is made from a conductive metal, for example, copper. Ribbon 50 may also have a conductive metal core, e.g. of copper, coated in silver, lead, tin, lead-tin, or tin-bismuth. The coating may be done by electroplating.

Ribbon 50 may be disposed over and attached to busbar 15 of the front surface metallization as shown in FIG. 5. Ribbon 50 may be attached to busbar 15 by soldering. Disposing ribbon 50 over the busbar and soldering ribbon 50 to the busbar is advantageous because this eliminates the need for separate contact pads to connect the ribbon. Eliminating contact pads which are generally made from silver reduces the cost of the solar cell. Ribbon 50 may be attached to the rear surface metallization via busbars on the rear surface of the solar cell. Generally, multiple ribbons connect one solar cell to an adjacent solar cell. Ribbon 50 runs from one solar cell to an adjacent solar cell via the opening created by the recessing portions 42 of the solar cells. Ribbon 50 bends slightly as it passes through this opening.

Figure 8:
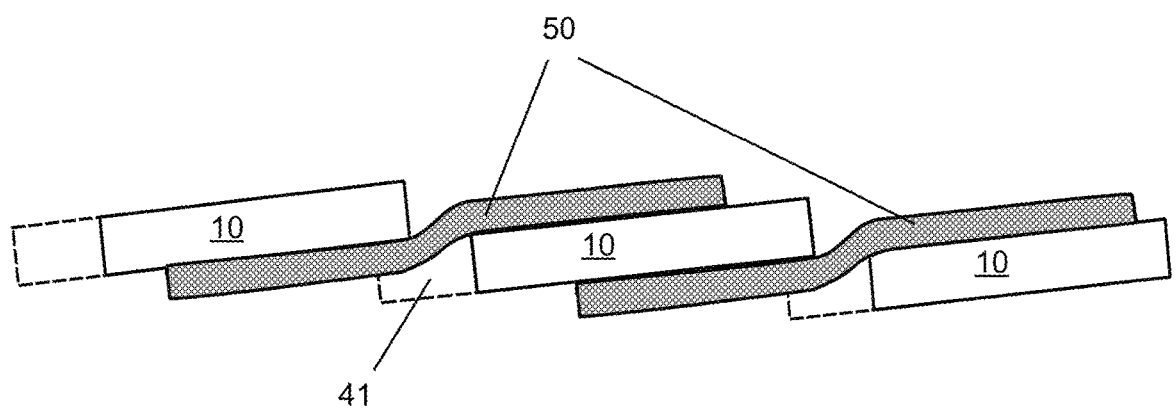
FIG. 8 schematically illustrates a cross-sectional view of the string of solar cells in FIG. 7 viewed from line 8-8.
Figure 7:
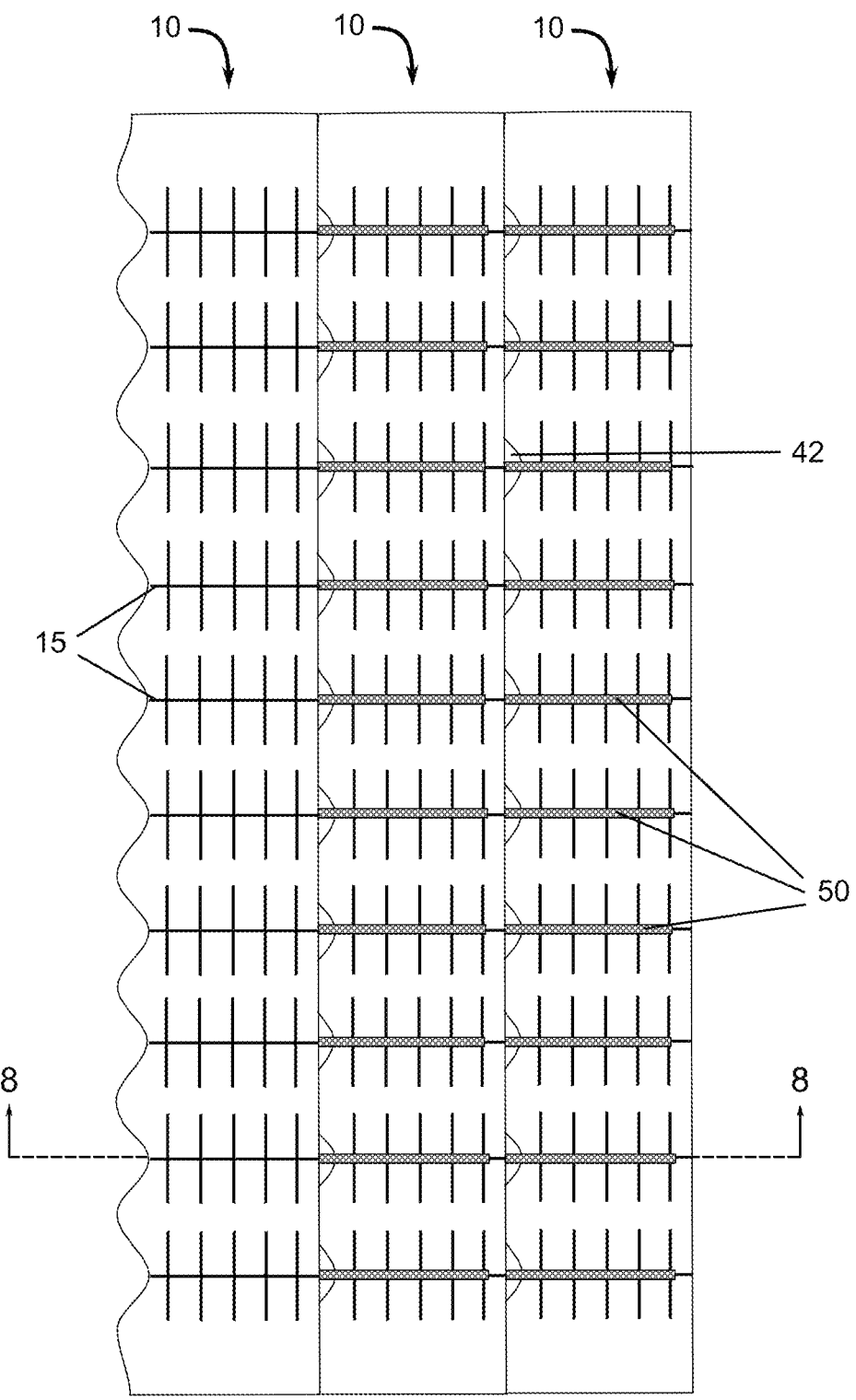
FIG. 7 schematically illustrates a plan view of a string of solar cells.

FIG. 7 shows a schematic diagram of a plan (front surface) view of string of series-connected solar cells 10 shown in FIG. 4B arranged in a shingled manner. The solar cells are arranged so that the protruding portions 41 of one solar cell overlaps with an adjacent solar cell but recessing portion 42 does not overlap with the adjacent solar cell. This arrangement creates an opening comprising the recessing portions of solar cells 10. FIG. 8 shows a cross-sectional view of the string of solar cells viewed through line 8-8 in FIG. 7. Protruding portions 41 outlined with dashed lines in FIG. 8 are behind ribbon 50 in this cross-sectional view. Solar cells 10 are electrically connected in series to each other using electrically conductive ribbons 50 to connect the front surface metallization (not shown in FIG. 8) of one solar cell with the rear surface metallization (not shown in FIGS. 7 & 8) of an adjacent solar cell. Ribbon 50 may be disposed over and attached to busbar 15 of the front surface metallization as shown in FIG. 7. Ribbon 50 may be attached to busbar 15 by soldering. Generally, multiple ribbons connect one solar cell to an adjacent solar cell. Ribbon 50 runs from one solar cell to an adjacent solar cell via the opening created by the recessing portions 42 of the solar cells. Ribbon 50 bends slightly as it passes through this opening.

Figure 16:
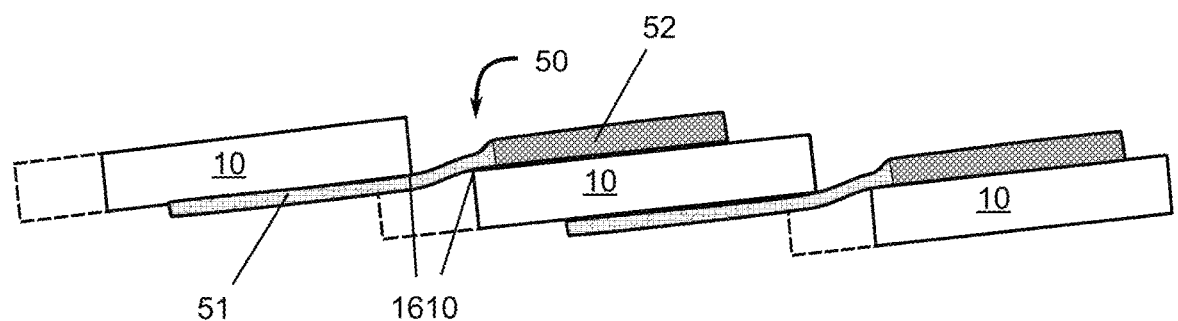
FIG. 16 schematically illustrates a cross-sectional view of a string of solar cells.

FIG. 16 shows an alternate embodiment of ribbon 50 having two sections: section 51 having a flat rectangular cross-sectional area and section 52 having a triangular cross-sectional area. Section 51 is attached to the rear surface of solar cell 10 and continues to the front side of an adjacent solar cell. The advantage to having a flat cross-sectional area as the ribbon passes through the opening created by the recessing portions is that the corners 1610 of the solar cells may place less stress on a flat ribbon than for example a ribbon with a circular cross-sectional area. The advantage to having triangular cross-sectional area for section 52 is that a triangular cross-sectional area will allow more light to reach the front surface of the solar cell than a ribbon with a flat cross-sectional area. Ribbon 50 in FIG. 16 may be one continuous ribbon with differently shaped cross-sectional area or alternatively, ribbon 50 may comprise two distinct segments joined together or two separate segments attached to a common contact pad (not shown) on the front surface of the solar cell.

There are multiple advantages to the arrangement solar cells shown in FIGS. 5-8 as compared to the arrangement of solar cells shown in FIGS. 2 & 3. By having the ribbon pass through the opening created by the recessing portions of the solar cells, the solar cells may be brought closer together than is possible in the arrangement of FIG. 2. Solar cells being closer together more efficiently uses the given space in a solar module and provides for more surface area for electricity generation in the solar module. Further, electrically conductive adhesive (ECA) is not used in the arrangement solar cells shown in FIGS. 5-8. This simplifies the manufacturing process steps because a separate step for printing the ECA and another step for oven curing the ECA are not needed. The arrangement solar cells shown in FIGS. 5-8 is also more advantageous than the arrangement shown in FIG. 3B because the ribbons in FIGS. 5-8 are not sandwiched between two solar cells at any point. For example, at the junction between solar cells in FIG. 3B, there is a stack of 3 layers that includes solar cell—ribbon—solar cell. This stack puts stress on the portion of the ribbon that is sandwiched between the two solar cells which may lead to fatigue failure. In FIGS. 6 & 8, this stack of 3 layers does not exist since ribbons 50 are passing through openings. Since ribbons 50 are not sandwiched between two solar cells, much less stress is placed on the portion of the ribbon at the junction between two solar cells.

Figure 9:
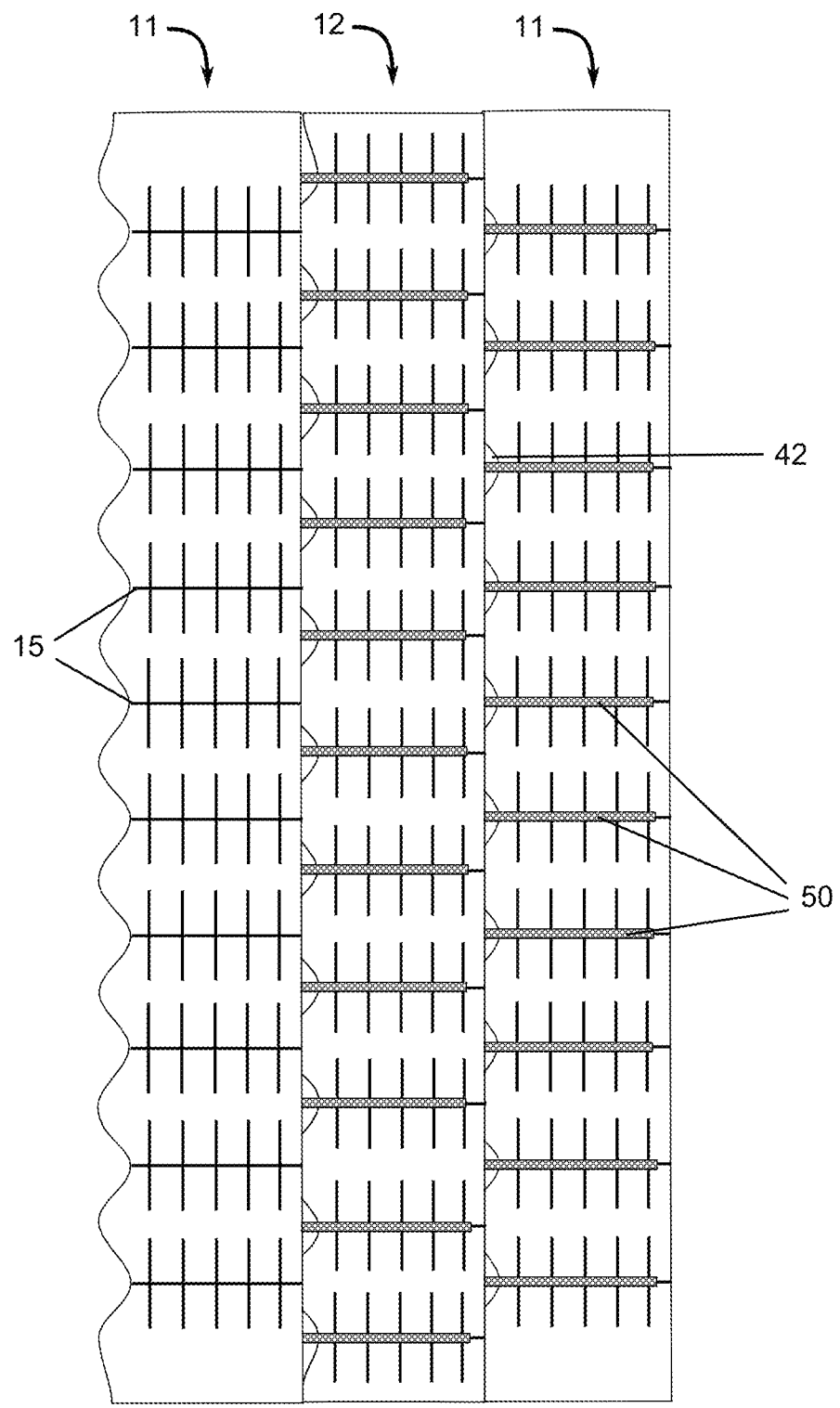
FIG. 9 schematically illustrates a plan view of a string of solar cells.

FIG. 9 shows a schematic diagram of a plan (front surface) view of two types of solar cells 11 & 12 alternately arranged in a shingled manner. The solar cell 11 differs from solar cell 12 in that the protruding portions and the recessing portions of the corrugated sides of the solar cells are offset and complementary. For example, a recessing portion of solar cell 11 is horizontally (e.g. an axis parallel to the short side of the solar cell) aligned with a protruding portion of solar cell 12 and a protruding portion of solar cell 11 is horizontally aligned with a recessing portion of solar cell 12. As with the embodiments discussed above, ribbons 50 pass through the openings created by the recessing portions of the solar cells. Using two types of solar cells, such as solar cells 11 & 12, is advantageous because these two types of solar cells can be cut from a silicon wafer with less wastage of silicon material. Since the recessing and protruding portions of solar cells 11 & 12 are complementary, the corrugated sides of these solar cells can be made using a single cut of a silicon wafer.

Figure 14:
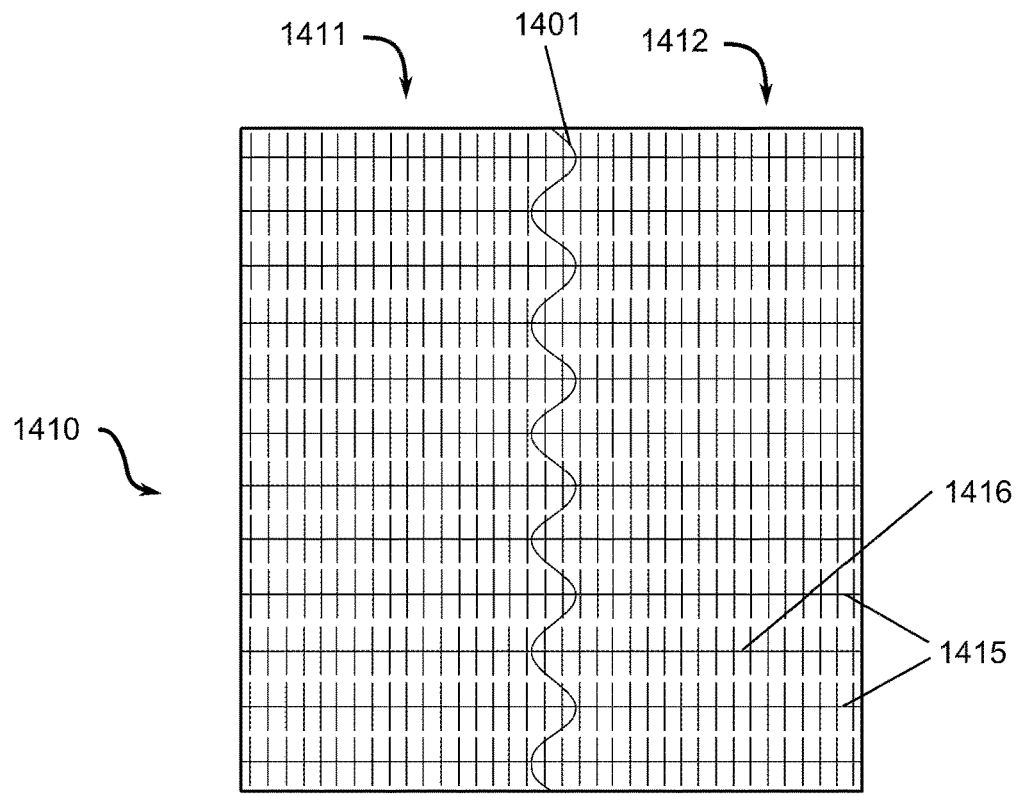
FIG. 14 schematically illustrates a plan view of a solar cell.

In some instances, it may be desirable to cut solar cells from industry standard solar cell designs. This may be more cost effective since industry standard solar cells can be made and purchased at a lower price than custom made solar cells. FIG. 14 shows a schematic illustration of the front surface of an industry standard 12 bus bar solar cell, also known as a 12 BB or a MBB (multi busbar) solar cell. It is understood that industry standard MBB solar cells may have more or less than 12 bus bars. MBB solar cell 1410 may be cut along cut line 1401 to produce two solar cells 1411 and 1412 having a corrugated shape. Solar cells 1411 and 1412 have recessing portions that correspond to every other bus bar. In other words, if one bus bar ends in a recessing portion of the corrugated shape, the adjacent bus bars will end in protruding portions of the corrugated side. For example, bus bar 1416 ends in a protruding portion of the corrugated side of solar cell 1412 and adjacent bus bars 1415 end in recessing portions of the corrugated side of solar cell 1412.

Figure 15:
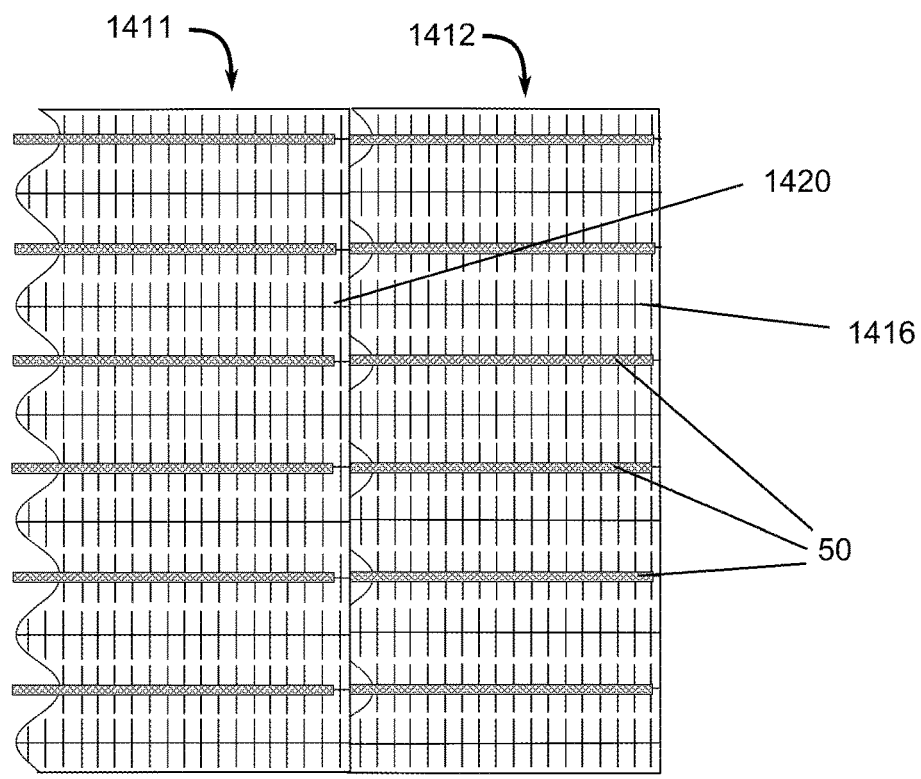
FIG. 15 schematically illustrates a plan view of string of solar cells.

Solar cells 1411 and 1412 cut from industry standard MBB solar cells may be shingled and electrically connected in series as shown in FIG. 15. Solar cell 1412 is oriented in the same manner as in FIG. 14, whereas solar cell 1411 is rotated 180 degrees so that its corrugated shaped side is oriented in the same direction as solar cell 1412 corrugated side. Ribbons 50 are attached to the bus bars 1415 that end at a recessing portions. Ribbons 50 of solar cell 1412 pass through the opening created by the recessing portions to connect to the rear surface of adjacent solar cell 1411. It is understood that more solar cells may be shingled and connected in series to the solar cells 1411 and 1412. Ribbons (not shown) may also be attached to bus bar 1416 at end in protruding portions to help collect current from the solar cell, but those ribbons would not connect to an adjacent solar cell. In some embodiments, it may be beneficial to use ECA in area 1420 where solar cell 1412 overlaps with solar cell 1411. The ECA may be placed in this area between solar cells 1411 and 1412 to decrease series resistance and reduce stress on the shingled solar cells since the ECA may act as a cushion against stress placed on the solar cells.

Figure 10:
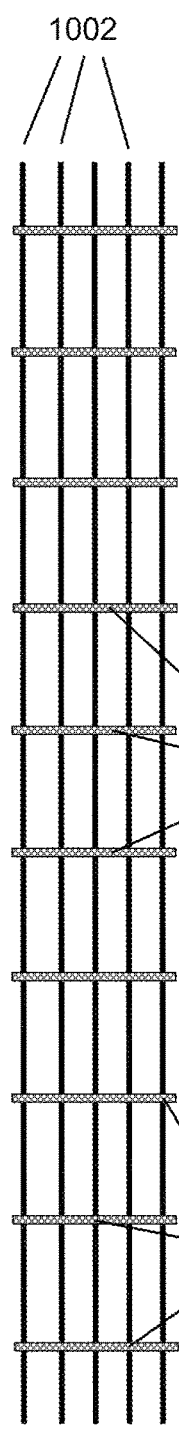
FIG. 10 schematically illustrates a wire mesh.

Use of a wire mesh may also reduce the resistances in a solar cell. FIG. 10 shows a schematic diagram of a wire mesh 1001 comprising wires 1002 and ribbons 1050. Ribbons 1050 and wires 1002 are made from a conductive metal, for example, copper. The ribbons 1050 and wires 1002 may also have a conductive metal core, e.g. of copper, coated in silver, lead, tin, lead-tin, or tin-bismuth. In the wire mesh, ribbons 1050 are oriented substantially parallel to each other, wires 1002 are oriented substantially parallel to each other, and ribbons 1050 are oriented substantially perpendicular to wires 1002. Ribbons 1050 and wires 1002 may be attached together at junctions 1010 between ribbons 1050 and wires 1002. Ribbons and wires may be attached to each other by soldering or the use of an adhesive.

Figure 11:
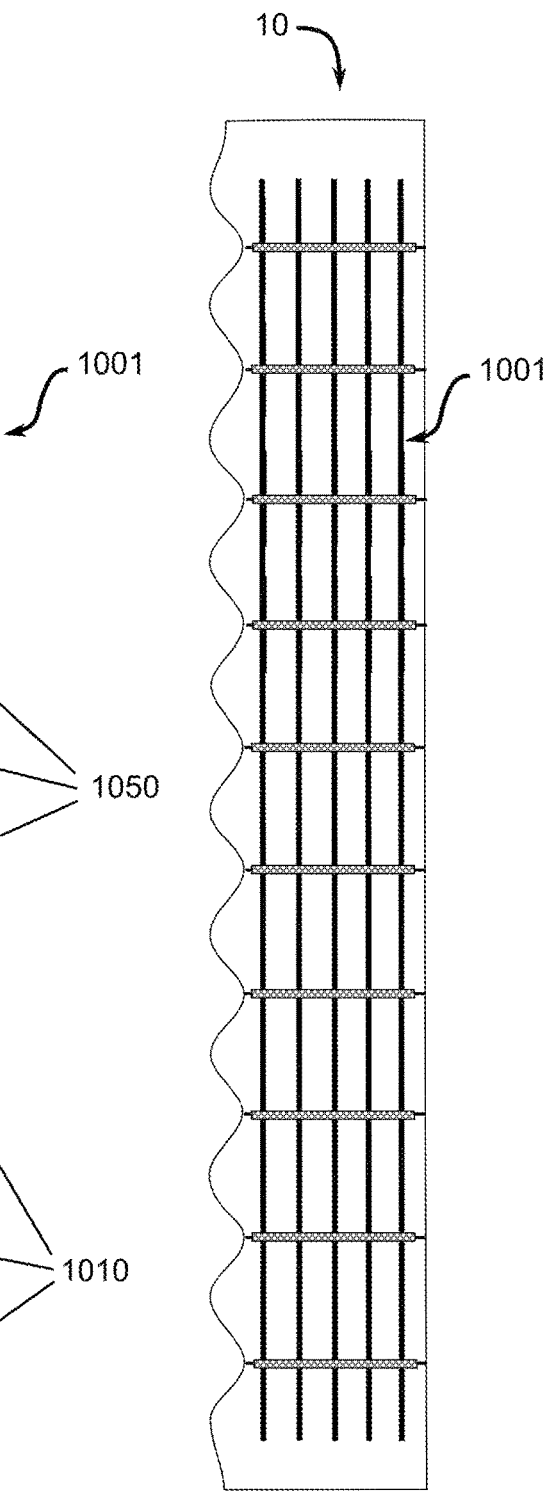
FIGS. 11 and 12 schematically illustrate solar cells with a wire mesh.
Figure 12:
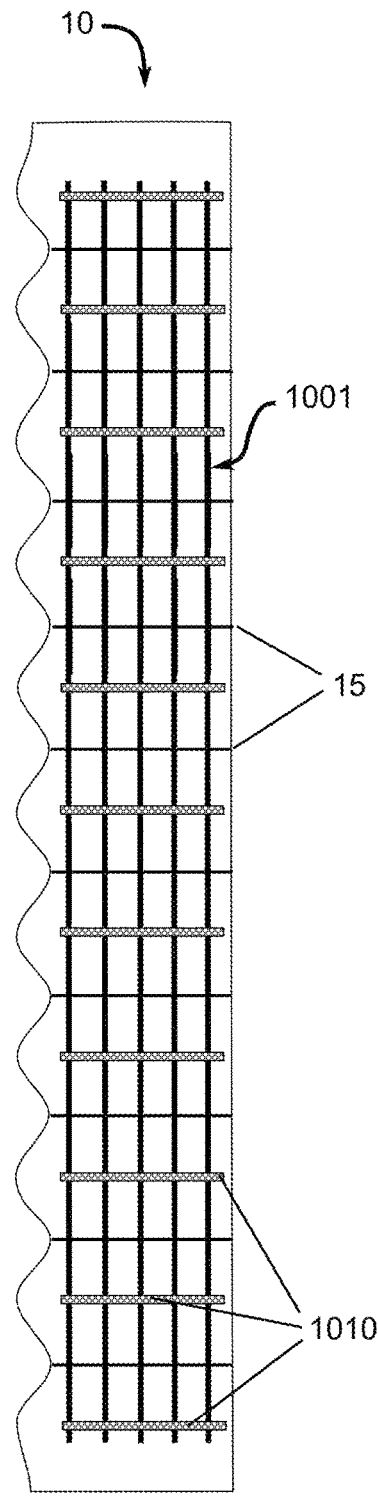

Wire mesh 1001 may be disposed on the metallization of a solar cell. For example, FIG. 11 shows wire mesh 1001 disposed on the front surface of solar cell 10 as shown in FIG. 4B. Wire mesh 1001 may be disposed on other types of solar cells and other types of metallization patterns. Wire mesh 1001 may be disposed on the rear surface metallization of a solar cell. In FIG. 11, wires 1002 are disposed over and attached to the fingers of the metallization. Wires 1002 may be attached to the fingers by soldering. In FIG. 11, ribbons 1010 are aligned with busbars 15 of the metallization pattern. FIG. 12 shows a schematic diagram of an alternative embodiment of wire mesh 1001 where ribbons 1010 are not aligned with, e.g. offset from, and not disposed over busbars 15. Disposing wire mesh 1001 onto the metallization of a solar cell will decrease the series resistance of the solar cell and improve the solar cell's efficiency.

Figure 13:
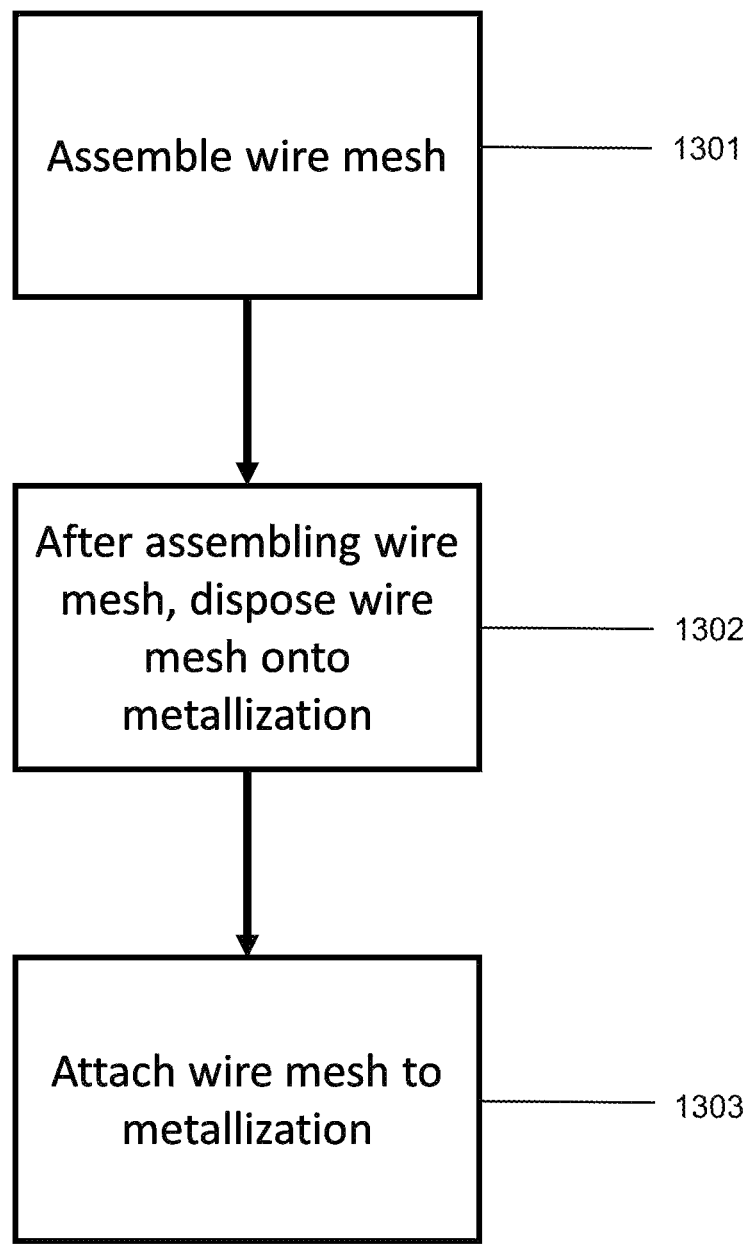
FIG. 13 is a flow chart for a method of assembling a solar cell.

FIG. 13 is a flow chart showing steps for attaching a wire mesh onto a solar cell. In step 1301, the wire mesh is assembled e.g. by attaching the ribbons to the wires of the mesh. In step 1302, after assembling the wire mesh, the wire mesh is disposed onto the metallization of the solar cell. In some embodiments, the wire mesh is disposed onto the metallization so that wires 1002 of the wire mesh are disposed onto the fingers of the metallization. In step 1303, the wire mesh is attached to the metallization, e.g. by soldering wires 1002 of the wire mesh onto the fingers of the metallization. One advantage of assembling the wire mesh before attaching the wire mesh to the solar cell is that the attachment step can be done as a single step. The alternative to this is to first solder the wires onto the fingers of the metallization which is a time-consuming process when multiple individual wires need to be soldered for each solar cell. In the method of FIG. 13, only one wire mesh needs to be soldered onto the solar cell metallization.

This disclosure is illustrative and not limiting. Further modifications will be apparent to one skilled in the art in light of this disclosure and are intended to fall within the scope of the appended claims. For example, where methods and steps described above indicate certain events occurring in certain order, those of ordinary skill in the art will recognize that the ordering of certain steps may be modified, and that some steps may be omitted or additional steps added, and that such modifications are in accordance with the variations of the invention.

What is claimed is:

1. A device comprising:
   a string of solar cells comprising
   at least first and second substantially rectangular crystalline silicon solar cells electrically connected in series, each solar cell comprising front and rear surfaces each having a metallization pattern, a first long side having a corrugated shape with protruding portions and recessing portions, and a second long side; the first and second solar cells arranged in a shingled manner with the protruding portions of the first long side of the second solar cell overlapping with the second long side of the first solar cell;
   an opening comprising one of the recessing portions of the first long side of the second solar cell; and
   an electrically conductive ribbon passing through the opening connecting the front surface metallization pattern of the second solar cell with the rear surface metallization pattern of the first solar cell.

2. The device of claim 1, wherein the front surface metallization pattern of each solar cell comprises a plurality of busbars oriented parallel to a short side of the solar cell; and the electrically conductive ribbon is disposed on one of the busbars of the second solar cell.

3. The device of claim 1, wherein the electrically conductive ribbon comprises a first portion with a flat rectangular cross-sectional area and second portion with a triangular cross-sectional area.

4. The device of claim 2, wherein a portion of the electrically conductive ribbon runs substantially parallel to the short side of the second solar cell and wherein the portion is disposed on and attached to one of the busbars of the second solar cell.

5. The device of claim 1, wherein the front surface metallization pattern of each solar cell comprises a busbar oriented parallel to a short side of the solar cell and wherein the busbar is aligned with one of the recessing portions of the first long side of each solar cell.

6. The device of claim 1, wherein the recessing portions of the first solar cell are not aligned with the recessing portions of the second solar cell.

7. The device of claim 1, wherein the second long side of each solar cell is straight.

8. The device of claim 1, wherein the second long side has a corrugated shape with protruding portions and recessing portions.

9. The device of claim 1, comprising a third substantially rectangular crystalline silicon solar cell, the second and third solar cells arranged in a shingled manner with the protruding portions of the first long side of the third solar cell overlapping with the second long side of the second solar cell.

10. The device of claim 9, wherein the recessing portions of the first solar cell are aligned with the recessing portion of the third solar cell and not aligned with the recessing portions of the second solar cell.

11. The device of claim 10, wherein the front surface metallization pattern of each solar cell comprises a busbar oriented parallel to a short side of the solar cell and wherein the busbar is aligned with one of the recessing portions of the first long side of each solar cell.

12. The device of claim 11, wherein the second long side of each solar cell is straight.

13. The device of claim 1, comprising a second opening comprising another one of the recessing portions of the first long side of the second solar cell; and a second electrically conductive ribbon passing through the second opening connecting the front surface metallization pattern of the second solar cell with the rear surface metallization pattern of the first solar cell.

* * * * *